(12) United States Patent
Conway et al.

(10) Patent No.: US 8,878,163 B2
(45) Date of Patent: Nov. 4, 2014

(54) LIGHT-EMITTING DEVICE AND 9.9 BIPHENYL FLUORENE MATERIALS THEREFOR

(75) Inventors: Natasha M. Conway, Histon (GB); Mary J. McKiernan, Cottenham (GB); Brian Tierney, Cambridgeshire (GB)

(73) Assignees: Cambridge Display Technology Limited, Cambridgeshire (GB); Sumitomo Chemical Co., Ltd., Tokyo (JP)

( * ) Notice: Subject to any disclaimer, the term of this patent is extended or adjusted under 35 U.S.C. 154(b) by 775 days.

(21) Appl. No.: 12/744,048

(22) PCT Filed: Nov. 18, 2008

(86) PCT No.: PCT/GB2008/003872
§ 371 (c)(1),
(2), (4) Date: Jul. 8, 2010

(87) PCT Pub. No.: WO2009/066061
PCT Pub. Date: May 28, 2009

(65) Prior Publication Data
US 2010/0276674 A1 Nov. 4, 2010

(30) Foreign Application Priority Data
Nov. 21, 2007 (GB) .................................. 0722846.3

(51) Int. Cl.
*H01L 29/08* (2006.01)
*H01L 51/00* (2006.01)
*H01L 51/50* (2006.01)

(52) U.S. Cl.
CPC ........ *H01L 51/0039* (2013.01); *H01L 51/0043* (2013.01); *H01L 51/5048* (2013.01)
USPC ........................................................ 257/40

(58) Field of Classification Search
USPC ........................................................ 257/40
See application file for complete search history.

(56) References Cited

U.S. PATENT DOCUMENTS

| 5,150,006 A | 9/1992 | Van Slyke et al. |
| 5,432,014 A | 7/1995 | Sano et al. |

(Continued)

FOREIGN PATENT DOCUMENTS

| EP | 0 707 020 A2 | 4/1996 |
| EP | 0 842 208 A1 | 5/1998 |

(Continued)

OTHER PUBLICATIONS

Chung-Wen Wu, Chien-Min Tsai, and Hong-Cheu Lin, "Synthesis and Characterization of Poly(fluorene)-Based Copolymers Containing Various 1,3,4-Oxadiazole Dendritic Pendants", Apr. 26, 2006, Department of Materials Science and Engineering, National Chiao Tung UniVersity, Macromolecules 2006, 39, 4298-4305.*

(Continued)

*Primary Examiner* — Caleb Henry
(74) *Attorney, Agent, or Firm* — Marshall, Gerstein & Borun LLP

(57) ABSTRACT

An organic light-emitting device comprising an anode; a hole transport layer; a light-emitting layer; and a cathode, characterized in that the hole transport layer comprises a polymer having a repeat unit comprising a 9,9 biphenyl fluorene unit wherein the 9-phenyl rings are independently and optionally substituted and the fluorene unit is optionally fused.

31 Claims, 2 Drawing Sheets

(56) References Cited

U.S. PATENT DOCUMENTS

| | | | |
|---|---|---|---|
| 5,621,131 A * | 4/1997 | Kreuder et al. | 558/46 |
| 5,698,740 A * | 12/1997 | Enokida et al. | 564/308 |
| 5,723,873 A | 3/1998 | Yang | |
| 5,777,070 A * | 7/1998 | Inbasekaran et al. | 528/394 |
| 5,798,170 A | 8/1998 | Zhang et al. | |
| 5,962,631 A * | 10/1999 | Woo et al. | 528/397 |
| 6,083,634 A | 7/2000 | Shi | |
| 6,353,083 B1 * | 3/2002 | Inbasekaran et al. | 528/295 |
| 6,653,438 B1 * | 11/2003 | Spreitzer et al. | 528/394 |
| 7,030,138 B2 | 4/2006 | Fujimoto et al. | |
| 7,094,477 B2 | 8/2006 | Kamatani et al. | |
| 7,125,998 B2 | 10/2006 | Stossel et al. | |
| 7,147,935 B2 | 12/2006 | Kamatani et al. | |
| 7,238,435 B2 | 7/2007 | Kamatani et al. | |
| 7,629,429 B2 * | 12/2009 | O'Dell et al. | 528/4 |
| 7,633,220 B2 * | 12/2009 | Lewis et al. | 313/504 |
| 7,939,155 B2 * | 5/2011 | Chen et al. | 428/90 |
| 7,973,467 B2 * | 7/2011 | Song et al. | 313/504 |
| 8,034,882 B2 * | 10/2011 | Yu et al. | 525/423 |
| 2002/0117662 A1 | 8/2002 | Nii | |
| 2002/0132134 A1 | 9/2002 | Hu et al. | |
| 2002/0182441 A1 | 12/2002 | Lamansky et al. | |
| 2003/0091862 A1 | 5/2003 | Tokito et al. | |
| 2005/0147846 A1 * | 7/2005 | Marks et al. | 428/690 |
| 2007/0228399 A1 | 10/2007 | Iwawaki et al. | |
| 2009/0174311 A1 | 7/2009 | Patel et al. | |

FOREIGN PATENT DOCUMENTS

| | | | |
|---|---|---|---|
| EP | 0 880 303 A1 | 11/1998 | |
| EP | 0 901 176 A2 | 3/1999 | |
| EP | 0 947 123 A1 | 10/1999 | |
| EP | 0 949 850 A1 | 10/1999 | |
| EP | 1 088 875 A2 | 4/2001 | |
| EP | 1 245 659 A1 | 10/2002 | |
| EP | 1 892 730 A1 | 2/2008 | |
| EP | 2 070 965 A1 | 6/2009 | |
| GB | 2 348 316 A | 9/2000 | |
| GB | WO02/092723 A1 * | 11/2002 | C08G 61/02 |
| GB | WO02/092724 A1 * | 11/2002 | C08G 61/02 |
| GB | WO03/095586 A1 * | 11/2003 | C08G 61/02 |
| JP | 10-095972 A | 4/1998 | |
| JP | 2001-172339 A | 6/2001 | |
| JP | 2002-324679 A | 11/2002 | |
| JP | 2005-120030 A | 5/2005 | |
| JP | 2007-049055 A | 2/2007 | |
| JP | 2007-520858 A | 7/2007 | |
| JP | 2008-106125 A | 5/2008 | |
| WO | WO-96/20253 A1 | 7/1996 | |
| WO | WO-98/10621 A1 | 3/1998 | |
| WO | WO-98/57381 A1 | 12/1998 | |
| WO | WO-99/20675 A1 | 4/1999 | |
| WO | WO-99/48160 A1 | 9/1999 | |
| WO | WO-00/48258 A1 | 8/2000 | |
| WO | WO-00/53656 A1 | 9/2000 | |
| WO | WO-00/55927 A1 | 9/2000 | |
| WO | WO-01/19142 A1 | 3/2001 | |
| WO | WO-01/62869 A1 | 8/2001 | |
| WO | WO-01/81649 A1 | 11/2001 | |
| WO | WO-02/09273 A1 | 1/2002 | |
| WO | WO-02/09274 A1 | 1/2002 | |
| WO | WO-02/31896 A2 | 4/2002 | |
| WO | WO-02/44189 A1 | 6/2002 | |
| WO | WO-02/45466 A1 | 6/2002 | |
| WO | WO-02/066552 A1 | 8/2002 | |
| WO | WO-02/068435 A1 | 9/2002 | |
| WO | WO-02/081448 A1 | 10/2002 | |
| WO | WO-02/084759 A1 | 10/2002 | |
| WO | WO-03/018653 A1 | 3/2003 | |
| WO | WO-03/022908 A1 | 3/2003 | |
| WO | WO-03/095586 A1 | 11/2003 | |
| WO | WO-2004/023573 A2 | 3/2004 | |
| WO | WO-2004/083277 A1 | 9/2004 | |
| WO | WO-2005/049686 A1 | 6/2005 | |
| WO | WO-2005/052027 A1 | 6/2005 | |
| WO | WO-2006/040530 A1 | 4/2006 | |
| WO | WO-2006/043087 A1 | 4/2006 | |
| WO | WO 2006040530 A1 * | 4/2006 | C08G 61/02 |
| WO | WO-2006/067483 A1 | 6/2006 | |
| WO | WO-2006/070185 A1 | 7/2006 | |
| WO | WO-2006/109083 A1 | 10/2006 | |

OTHER PUBLICATIONS

Bernius et al., "Progress with Light-Emitting Polymers," *Adv. Mater.*, 12(23):1737-1750 (2000).

Chen et al., "Recent Developments in Molecular Organic Electroluminescent Materials," *Macromol. Symp.*, 125:1-48 (1997).

Chen et al., "Triplet Exciton Confinement in Phosphorescent Polymer Light-Emitting Diodes," *Appl. Phys. Lett.*, 82(7):1006-1008 (2003).

Cleave et al., "Harvesting Singlet and Triplet Energy in Polymer LEDs," *Adv. Mater.*, 11(4):285-288 (1999).

Ikai et al., "Highly Efficient Phosphorescence from Organic Light-Emitting Devices with an Exciton-Block Layer," *Appl. Phys. Lett.*, 79(2):156-158 (2001).

Lane et al., "Origin of Electrophosphorescence from a Doped Polymer Light Emitting Diode," *Phys. Rev. B*, 63:235206-1-235206-8 (2001).

Lee et al., "Polymer Phosphorescent Light-Emitting Devices Doped with Tris(2-phenylpyridine) Iridium as a Triplet Emitter," *Appl. Phys. Lett.*, 77(15):2280-2282 (2000).

O'Brien et al., "Electrophosphorescence from a Doped Polymer Light Emitting Diode," *Synth. Met.*, 116:379-383 (2001).

Setayesh et al., "Bridging the Gap Between Polyfluorene and Ladder-Poly-*p*-phenylene: Synthesis and Characterization of Poly-2,8-indenofluorene," *Macromolecules*, 33(6):2016-2020 (2000).

Setayesh et al., "Polyfluorenes with Polyphenylene Dendron Side Chains: Toward Non-Aggregating, Light-Emitting Polymers," *J. Am. Chem. Soc.*, 123(5):946-953 (2001).

Tokito et al., "Metal Oxides as a Hole-Injecting Layer for an Organic Electroluminescent Device," *J. Phys. D: Appl. Phys.*, 29(11):2750-2753 (1996).

Yamaguchi et al., "Effect of B and C on the Ordering of $L1_o$-CoPt Thin Films," *Appl. Phys. Lett.*, 79(5):2001-2003 (2001).

Yamamoto, "Electrically Conducting and Thermally Stable π-Conjugated Poly(arylene)s Prepared by Organometallic Processes," *Prog. Polym. Sci.*, 17:1153-1205 (1992).

Yang et al., "Efficient Blue Polymer Light-Emitting Diodes from a Series of Soluble Poly(paraphenylene)s," *J. Appl. Phys.*, 79(2):934-939 (1996).

Zhu et al., "Synthesis of New Iridium Complexes and Their Electrophosphorescent Properties in Polymer Light-Emitting Diodes," *J. Mater. Chem.*, 13:50-55 (2003).

Examination Report for Application No. GB0722846.3, dated Feb. 2, 2010.

International Search Report and Written Opinion for Application No. PCT/GB2008/003872, dated Mar. 19, 2009.

Search Report for Application No. GB0722846.3, dated Mar. 17, 2008.

* cited by examiner

LIGHT-EMITTING DEVICE AND 9,9 BIPHENYL FLUORENE MATERIALS THEREFOR

BACKGROUND OF THE INVENTION

1. Field of the Invention

The present invention relates to organic-light emitting devices having a hole transport layer and to materials suitable for use in the hole transport layer.

2. Related Technology

A typical organic light-emitting device (OLED) comprises a substrate, on which is supported an anode, a cathode and a light-emitting layer situated in between the anode and cathode and comprising at least one polymeric electroluminescent material. In operation, holes are injected into the device through the anode and electrons are injected into the device through the cathode. The holes and electrons combine in the light-emitting layer to form an exciton which then undergoes radioactive decay to emit light. Other layers may be present in the OLED, for example a layer of hole injection material, such as poly(ethylene dioxythiophene)/polystyrene sulphonate (PEDOT/PSS), may be provided between the anode and the light-emitting layer to assist injection of holes from the anode to the light-emitting layer. Further, a hole transport layer may be provided between the anode and the light-emitting layer to assist transport of holes to the light-emitting layer.

Polymers used to fabricate the device are preferably soluble in common organic solvents to facilitate their deposition. One example of soluble polymers are polyfluorenes, which have good film forming properties and which may be readily formed by Suzuki or Yamamoto polymerization. This enables a high degree of control over the regioregulatory of the resultant polymer.

WO 99/20675 is concerned with a process for preparing conjugated polymers. 9,9-disubstituted fluorene units are disclosed where the substituent is selected from $C_1$-$C_{20}$ hydrocarbyl or $C_1$-$C_{20}$ hydrocarbyl containing one or more S, N, O, P or Si atoms, $C_4$-$C_{16}$ hydrocarbyl carbonyloxy, or $C_4$-$C_{16}$ alkyl(trialkylsiloxy). It is further said that the two substituents may form with the 9-carbon on the fluorene ring a $C_5$-$C_{20}$ ring structure or a $C_4$-$C_{20}$ ring structure containing one or more heteroatoms of S, N or O. Only an n-octyl substituent is exemplified.

J. Am. Chem. Soc. 2001, 123, 946-953 is concerned with blue-emitting hompolymers. Polymer 20b has the formula:

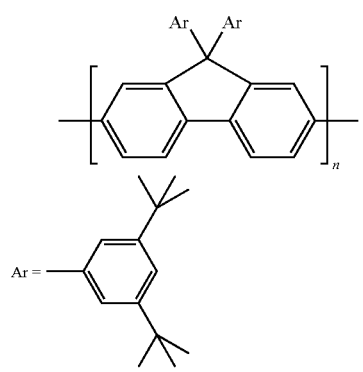

EP 1088875 discloses electroluminescent devices having phenyl anthracene-based polymers. An adamantane spacer group is incorporated into the polymer in order to increase Tg. Polymer 67 has a repeat unit of the following formula:

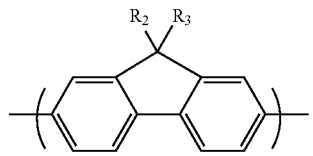

where $R_2$=$R_3$=4-methoxyphenyl. The polymer is said to be a luminescent material.

WO 02/092723 discloses blue emissive polymers. It is said that incorporation of 2,7-linked 9,9 diarylfluorene repeat units into the electroluminescent polymer increase the glass transition temperature (Tg). In particular, repeat unit of formula:

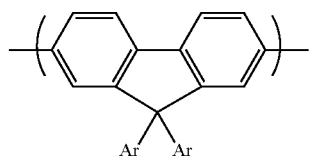

is disclosed, where preferably, each Ar is independently selected from the group consisting of an optionally substituted residue of formula:

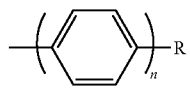

wherein n=1, 2 or 3 and R is a solubilizing group or hydrogen. Particularly preferred groups R are hydrogen and optionally substituted alkyl or alkoxy, most preferably R is hydrogen or butyl.

WO 02/092724 is concerned with electron transport and emissive polymers. Polymers according to one aspect of the invention of WO 02/092724 have a first repeat unit comprising a group having formula:

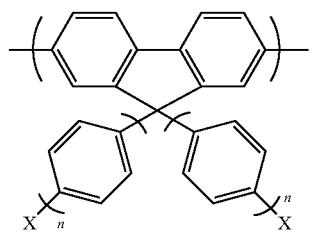

which is substituted or unsubstituted and where n is 1, 2 or 3 and X is hydrogen, or an alkyl, aryl, heteroaryl, alkoxy, arylalkyl, alkylaryl, cyano, halide, haloalkyl, haloaryl, haloheteroaryl or alkoxy group. Preferably, X is hydrogen or an alkyl group. These polymers are said to have higher Tg values than polymers previously used as electron transport materials. A Tg of 175° C. is mentioned. On page 9, it is said that it is preferred that X is selected from methyl, ethyl, n-butyl, s-butyl or tertiary butyl.

U.S. Pat. No. 6,653,438 is concerned with conjugated emissive polymers. A monomer for incorporating into a polymer is disclosed having the following formula:

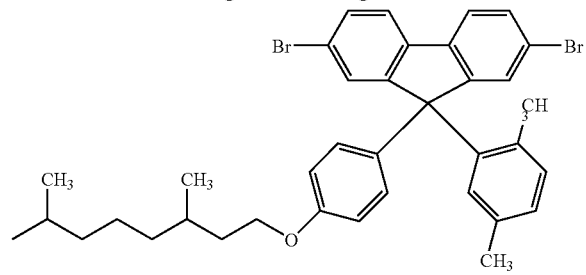

In Example P4, this monomer is incorporated into a polymer with a triphenylamine repeat unit and a second, different fluorene repeat unit.

WO 2004/023573 discloses a method of forming an optical device. According to the method, a first layer is formed over a first electrode and a second layer is formed in contact with the first layer. The first layer is rendered at least partially insoluble by one or more of heat, vacuum and ambient drying treatments before the second layer is deposited. The first layer is formed by depositing a first semiconducting material and the second layer is formed by depositing a second semiconducting material. It is said that where one or both of the first and second semiconducting materials are polymers, it is preferred that the polymers are conjugated it is further said that such [conjugated] polymers preferably comprise 9-substituted or 9,9-disubstituted fluorene, 2,7-diyl repeat units, most preferably optionally substituted units of formula:

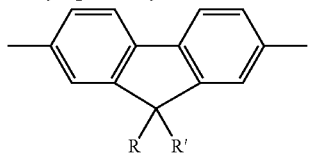

wherein R and R' are independently selected from hydrogen, or optionally substituted alkyl, alkoxy, aryl, arylalkyl, heteroaryl and heteroarylalkyl.

WO 2006/070185 relates to amine monomers and polymers. It is said that particularly preferred amine polymers include optionally substituted 2,7-linked fluorenes, most preferably repeat units of formula:

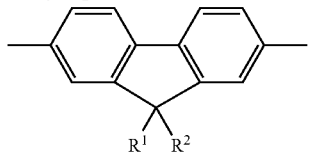

wherein $R_1$ and $R_2$ are independently selected from hydrogen or optionally substituted alkyl, alkoxy, aryl, arylalkyl, heteroaryl and heteroarylalkyl. It is stated on page 18 that preferred hole transporting polymers are AB copolymers or a "first repeat unit" and a triarylamine repeat unit. The "first repeat unit" is defined as being selected from arylene repeat units.

There is always a need to provide new and, preferably, improved materials for the hole transport layer in a light-emitting device. In particular, it is desirable to find new and, preferably, improved materials that can be used as a common hole transport layer for blue, red and green electroluminescent materials in a full color display.

As stated in WO 2004/023573, when forming the light-emitting device it may be preferable to heat the hole transport layer prior to formation of the light-emitting layer. More preferably, the hole transport layer is heated at above the glass transition temperature of the hole transporting material. As such, it is further desirable to provide a hole transport material with a low glass transition temperature (Tg) so that it can be heated to above this Tg.

SUMMARY OF THE INVENTION

The present inventors have unexpectedly at least partially solved the above problems by providing a new hole transport polymer incorporating a repeat unit which affords increased stability to the polymer (leading to better lifetime when used in a device) and which can result in a polymer with desirable HOMO and LUMO levels in terms of compatibility with blue, red and green electroluminescent materials. These advantages are achieved without the repeat unit significantly increasing the Tg of the polymer. This result was completely unexpected since indications from the prior art were that this repeat unit would dramatically increase the Tg of the polymer.

In solution processed devices, it will be appreciated that it is important that the emissive layer does not dissolve the underlying hole transport layer when it is deposited from solution. The present inventors have surprisingly found that low Tg hole transport materials are rendered insoluble more readily than higher Tg materials.

As such, a first aspect of the present invention provides an organic light-emitting device comprising an anode; a hole transport layer; a light-emitting layer; and a cathode, characterised in that the hole transport layer comprises a polymer having a repeat unit comprising a fluorene unit in the polymer backbone and satisfying general formula I:

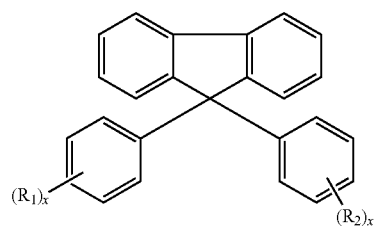

I where $R_1$ and $R_2$ each independently represent a substituent; each x independently is 0 or an integer; and the fluorene unit is optionally fused.

Preferably, the fluorene unit is not fused, and the repeat unit according to the first aspect of the invention satisfies general formula Ia:

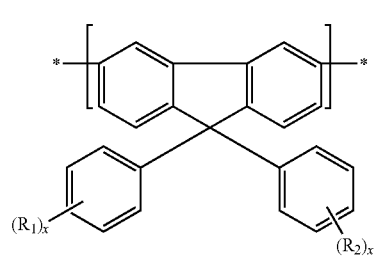

Ia

The repeat unit satisfying general formula I enables tuning of the interchain spacing while ensuring that the Tg of the polymer is practical for device processing. This may be achieved in part through chain length selection. The repeat unit satisfying general formula I further imparts enhanced stability to excitons and enhanced lifetime.

It also has been discovered that by using a hole transport polymer having a repeat unit satisfying general formula I, a reduction in drive voltage for the device can be achieved. This result was surprising since previously, it was thought that the drive voltage was controlled by the hole transport repeat units in the hole transport layer or in the light-emitting layer.

The organic light-emitting device as described anywhere herein preferably is comprised in a full color display having blue, red and green light-emitting layers, where the hole transport layer is common to the blue, red and green electroluminescent materials.

By "red electroluminescent material" is meant an organic material that by electroluminescence emits radiation having a wavelength in the range of 600-750 nm, preferably 600-700 nm, more preferably 610-650 nm and most preferably having an emission peak around 650-660 nm.

By "green electroluminescent material" is meant an organic material that by electroluminescence emits radiation having a wavelength in the range of 510-580 nm, preferably 510-570 nm.

By "blue electroluminescent material" is meant an organic material that by electroluminescence emits radiation having a wavelength in the range of 400-500 nm, more preferably 430-500 nm.

The Tg of the hole transport polymer preferably is below 200° C., more preferably below 175° C. The Tg of the hole transport polymer is measurable by differential scanning calorimetry. Values given herein are measured at 40 degrees/minute.

The hole transport polymer preferably has been heated after deposition, preferably at 180-200° C. for 20-60 minutes, in order to render the polymer insoluble. Preferably, the layer is insoluble to a depth of at least 5-10 nm.

Although not essential, the hole transport polymer may be provided with crosslinkable units that are crosslinked after deposition of the polymer. Suitable units to be present in the hole transport polymer for crosslinking and suitable techniques therefor will be known to those skilled in this art as disclosed in, for example, WO 96/20253, WO 05/49686 and WO 05/052027.

Preferably, the hole transport polymer is soluble so that it is capable of being deposited from solution to form a layer. Suitable solvents for polyarylenes, in particular polyfluorenes, include mono- or poly-alkylbenzenes such as toluene and xylene. Particularly preferred solution deposition techniques are spin-coating and inkjet printing.

The hole transport layer, located between anode and the light-emitting layer, preferably has a HOMO level of 4.5 to 5.8, more preferably around 4.8-5.5 eV. The HOMO level can be measured by cyclic voltammetry.

The fluorene unit in the repeat unit of general formula (I) is preferably not fused to any further ring structures. However, it may be fused to form units such as such as benzofluorene or indenofluorene. In the case where it is not fused, the fluorene unit is preferably linked to adjacent units through its 2- and 7-positions to maximise its conjugation to adjacent units. However, in certain cases it may be advantageous to link the fluorene unit through its 3- and/or 6-position in order to reduce the extent of conjugation within the polymer and thereby increase its bandgap.

Preferably one or both of $R_1$ and $R_2$ represents a substituent having from 1 to 12 carbon atoms, such as a linear or branched alkyl group. More preferably one or both of $R_1$ and $R_2$ represents a substituent having from 5 to 20 carbon atoms.

Preferably one or both of $R_1$ and $R_2$ represents a substituent comprising a polyethylene glycol chain or an alkoxy chain.

In one embodiment, at least one of $R_1$ and $R_2$ is located at a meta position on the phenyl ring. Preferred substituents to be present at the meta position include alkyl groups, preferably having more than five carbon atoms. The alkyl group may be linear or branched.

Advantageously, it has been found that fluorene units satisfying general formula I with substituent(s) at the meta position(s) have a superior lifetime but substantially the same Tg as the equivalent polymer where the repeat unit of formula I is replaced with a 9,9,dioctylfluorene repeat unit.

In one embodiment both $R_1$ and $R_2$ are located at meta positions.

The repeat unit may satisfy general formula II:

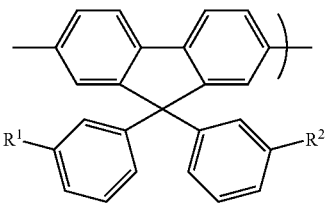

II

In another embodiment, at least one of $R_1$ and $R_2$ is located at the para position of the phenyl ring. Preferred substituents to be located at the para position have five or more carbon atoms.

In one embodiment both $R_1$ and $R_2$ are located at the para position and preferably each has five or more carbon atoms.

The repeat unit may satisfy general formula III:

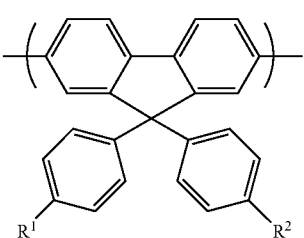

III

The repeat unit may satisfy general formula IV:

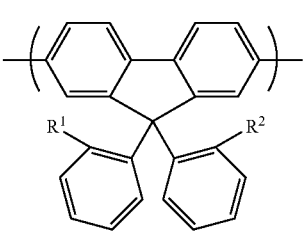

IV

According to the invention, the repeat unit satisfying general formula I may be comprised in a ring system comprising extended conjugation such as a ladder-type unit or an indenofluorene.

The repeat unit satisfying general formula I generally will not be responsible for transporting holes in the hole transport polymer. As such, preferably, the hole transport polymer is a copolymer. The hole transport polymer preferably includes a hole transport repeat unit, such as a triarylamine repeat unit.

The hole transport polymer preferably includes from 10 to 80 mol % repeat unit satisfying general formula I, more preferably 30 to 80 mol %, even more preferably 50 to 80 mol % or 30 to 60 mol %.

Preferably, the hole transport polymer includes a triarylamine repeat unit. Preferred triarylamine repeat units may be selected from those satisfying formula 1:

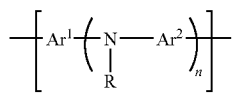

wherein $Ar^1$ and $Ar^2$ are optionally substituted aryl or heteroaryl groups, n is greater than or equal to 1, preferably 1 or 2, and R is H or a substituent, preferably a substituent. R is preferably alkyl or aryl or heteroaryl, most preferably aryl or heteroaryl. Any of the aryl or heteroaryl groups in the unit of formula 1 may be substituted. Preferred substituents include alkyl and alkoxy groups.

Any of the aryl or heteroaryl groups (i.e. $Ar^1$, $Ar^2$ and R in the case where R is aryl or heteroaryl) in the repeat unit of Formula 1 may be linked by a direct bond or a divalent linking atom or group. Preferred divalent linking atoms and groups include O, S; substituted N; and substituted C.

Particularly preferred units satisfying Formula 1 include units of Formulae 2 to 4:

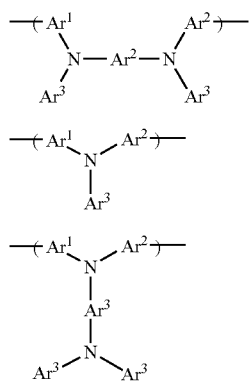

wherein $Ar^1$ and $Ar^2$ are as defined above; and $Ar^3$ is an optionally substituted aryl or heteroaryl group. Where present, preferred substituents for $Ar^3$ include alkyl and alkoxy groups. Any two of the aryl or heteroaryl groups $Ar^1$, $Ar^2$ and $Ar^3$ may optionally be linked by a direct bond or a divalent linking group or atom. Where present, a linking bond, group or atom preferably links two aryl or heteroaryl groups that are attached to a common N atom.

Preferred hole transport polymers are copolymers of a repeat unit satisfying general formula I and a triarylamine repeat unit.

Other repeat units may be present, for example a further fluorene repeat unit, preferably an optionally substituted, 2,7-linked fluorene, still more preferably satisfying general formula 22:

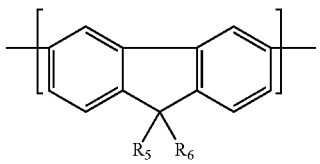

wherein $R_5$ and $R_6$ are independently selected from hydrogen or optionally substituted alkyl, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

In one embodiment, it is preferred that the hole transport polymer includes a 2,7-linked 9,9 di-alkylfluorene or 2,7-linked 9,9 di-alkoxyfluorene repeat unit.

A preferred hole transport polymer according to the invention consists of a 9,9-dialkyl or dialkyloxy fluorene repeat unit, a repeat unit satisfying general formula I, and one or more different triarylamine repeat units.

Another preferred hole transport polymer according to the invention consists of a repeat unit satisfying general formula I and one or more different triarylamine repeat units.

Preferably, the light-emitting device further has a hole injection layer located between the anode and the hole transport layer. Preferably, the hole injection layer comprises a conductive organic or inorganic material. Suitable conductive organic materials typically comprise a charged species, in particular a charged material such as a charged polymer, with a charge balancing dopant. Examples of doped organic hole injection materials include doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and poly(thienothiophene). Examples of conductive inorganic materials include transition metal oxides such as VOx MoOx and RuOx as disclosed in Journal of Physics D: Applied Physics (1996), 29(11), 2750-2753.

In another embodiment, one or both of the pendant phenyl groups in the repeat unit satisfying general formula I has one or more, preferably two, substituents. Where one or both of the pendent phenyl groups has two substituents, preferably, one substituent is located at each meta position on the phenyl ring.

A second aspect of the present invention provides a polymer suitable for use as a hole transport polymer in a light-emitting device, wherein the polymer has a repeat unit satisfying general formula I where the fluorene unit, $R_1$ and $R_2$ and x are as defined anywhere above in relation to formula I, characterized in that the polymer has a glass transition temperature below 175° C.

Preferably, the polymer according to the second aspect is a copolymer.

Preferably, in the polymer according to the second aspect, both pendant phenyl groups have a para substituent (more preferably, each with more than 3 carbon atoms, even more preferably more than 5 carbon atoms) or both phenyl groups have a meta substituent.

The polymer according to the second aspect may be as defined for a hole transport polymer according to the first aspect of the invention.

A third aspect of the present invention provides a monomer suitable for the preparation of a conjugated polymer comprising:

(A) a structural unit satisfying general formula I where $R_1$ and $R_2$ each independently represent a substituent; and (B) two reactive leaving groups, wherein:

(i) $R_1$ and $R_2$ are each independently located at the para position and contain five or more carbon atoms; or (ii) $R_1$ and $R_2$ each independently are located at a meta position and contain five or more carbon atoms; or (iii) one of $R_1$ and $R_2$ is located at a meta position and the other of $R_1$ and $R_2$ is located at the para position and $R_1$ and $R_2$ each independently contain five or more carbon atoms.

The two reactive leaving groups are preferably independently selected from the group consisting of boron derivative groups such as a boronic acid or boronic ester and leaving groups capable of participating in metal insertion such as halogens (preferably chlorine, bromine or iodine, most preferably bromine), tosylate, mesylate and triflate.

A fourth aspect of the present invention provides a method of making a light-emitting device as defined in relation to the first aspect, including a step of depositing the hole transport layer and then heating the hole transport layer.

BRIEF DESCRIPTION OF THE DRAWINGS

The present invention now will be described with reference to the attached Figures in which.

DETAILED DESCRIPTION

Figure 1:
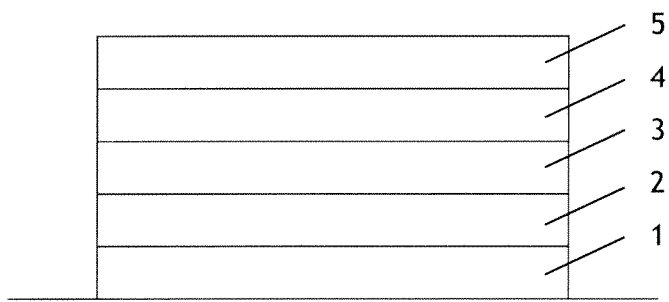
FIG. 1 shows a schematic representation of a device according to the invention.

The embodiment of FIG. 1 illustrates a device according to the invention wherein the device is formed by firstly forming an anode 1 on a substrate followed by deposition of a conductive hole injection layer 2; a hole transport layer 3; a light emitting layer 4 a cathode 5. However it will be appreciated that the device of the invention could also be formed by firstly forming a cathode on a substrate followed by deposition of other layers and finally an anode. An electron transporting layer may be present between the light-emitting layer ad the cathode. If present, an electron transporting layer preferably has a LUMO level of around 3-3.5 eV.

The anode preferably is made from ITO.

The cathode is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminum. Alternatively, it may comprise a plurality of metals, for example a bilayer of calcium and aluminum as disclosed in WO 98/10621, elemental barium disclosed in WO 98/57381, Appl. Phys. Lett. 2002, 81(4), 634 and WO 02/84759 or a thin layer of a compound to assist electron injection, for example a metal fluoride such as lithium fluoride disclosed in WO 00/48258 or barium fluoride disclosed in Appl. Phys. Lett. 2001, 79(5), 2001; or a metal oxide, in particular an alkali or alkali earth metal oxide such as barium oxide. In order to provide efficient injection of electrons into the device, the cathode preferably has a workfunction of less than 3.5 eV, more preferably less than 3.2 eV, most preferably less than 3 eV.

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant to preventingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

In a practical device, at least one of the electrodes is semi-transparent in order that light may be absorbed (in the case of a photoresponsive device) or emitted (in the case of an OLED). Where the anode is transparent, it typically comprises indium tin oxide. Examples of transparent cathodes are disclosed in, for example, GB 2348316.

The light-emitting layer may consist of the electroluminescent material alone or may comprise the electroluminescent material in combination with one or more further materials. In particular, the electroluminescent material may be blended with hole and/or electron transporting materials as disclosed in, for example, WO 99/48160. Alternatively, the electroluminescent material may be covalently bound to a charge transporting material.

Suitable electroluminescent polymers for use in the light-emitting layer include poly(arylene vinylenes) such as poly (p-phenylene vinylenes) and polyarylenes such as: polyfluorenes, particularly 2,7-linked 9,9 dialkyl polyfluorenes or 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene. Such polymers as disclosed in, for example, Adv. Mater. 2000 12(23) 1737-1750 and references therein.

Polymers used in the device preferably are conjugated and thus comprise an arylene repeat unit, in particular: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilizing groups such as $C_{1-20}$ alkyl or alkoxy; electron withdrawing groups such as fluorine, nitro or cyano; and, in the case of polymers other than those used in the hole transport layer, substituents for increasing glass transition temperature (Tg) of the polymer.

A polymer comprising an arylene repeat unit as referred to above may provide one or more of the functions of hole transport, electron transport and emission depending on which layer of the device it is used in and the nature of co-repeat units.

In particular:

a homopolymer of an arylene repeat unit, in particular as referred to above, such as a homopolymer of 9,9-dialkylfluoren-2,7-diyl, may be utilised to provide electron transport.

a copolymer comprising an arylene repeat unit, in particular as referred to above, and a triarylamine repeat unit, in particular a repeat unit selected from formulae 1 to 4, may be utilised to provide hole transport and/or emission.

Particularly preferred hole transporting polymers of this type are copolymers of an arylene repeat unit, in particular as referred to above, and a triarylamine repeat unit.

a copolymer comprising an arylene repeat unit, in particular as referred to above, and heteroarylene repeat unit may be utilised for charge transport or emission. Preferred heteroarylene repeat units are selected from formulae 7 to 21:

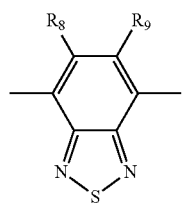

7 wherein $R_8$ and $R_9$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each a phenyl group.

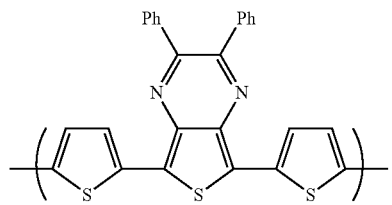

8

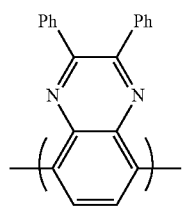

9

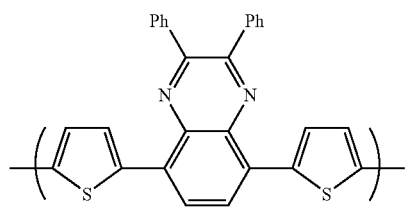

10

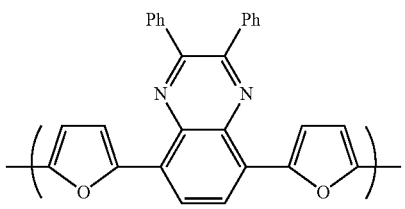

11

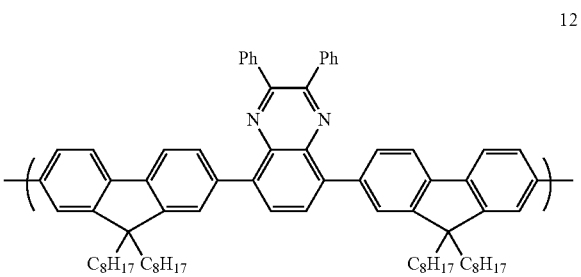

12

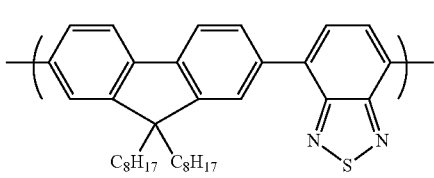

13

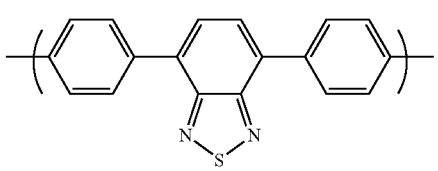

14

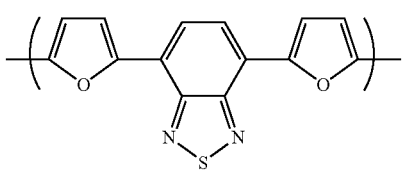

15

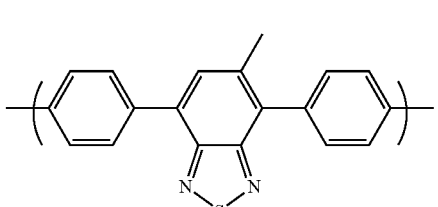

16

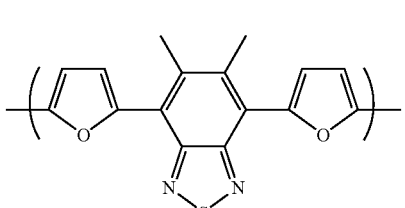

17

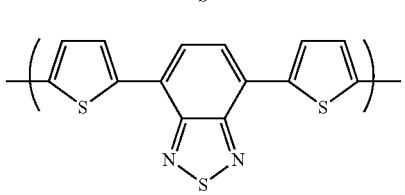

18

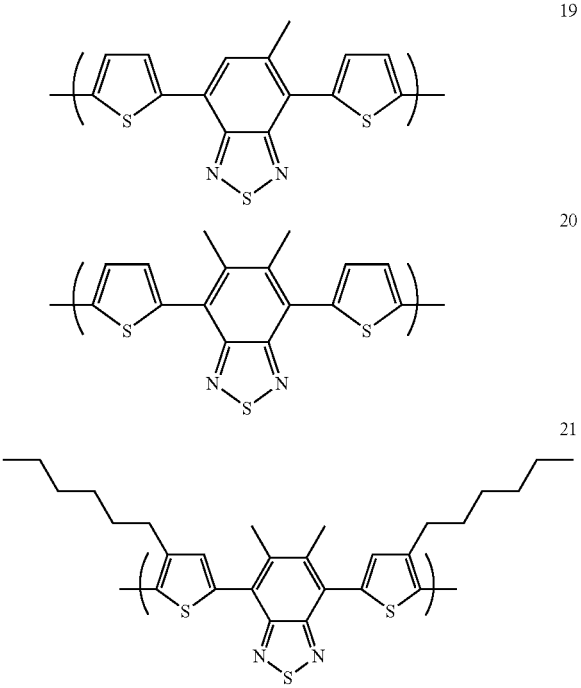

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality.

The different regions within such a polymer may be provided along the polymer backbone, as per U.S. Pat. No. 6,353,083, or as groups pendant from the polymer backbone as per WO 01/62869.

Preferred methods for preparation of conjugated polymers are Suzuki polymerization as described in, for example, WO 00/53656 and Yamamoto polymerization as described in, for example, T. Yamamoto, "Electrically Conducting And Thermally Stable π-Conjugated Poly(arylene)s Prepared by Organometallic Processes", Progress in Polymer Science 1993, 17, 1153-1205. These polymerization techniques both operate via a "metal insertion" wherein the metal atom of a metal complex catalyst is inserted between an aryl group and a leaving group of a monomer. In the case of Yamamoto polymerization, a nickel complex catalyst is used; in the case of Suzuki polymerization, a palladium complex catalyst is used.

For example, in the synthesis of a linear polymer by Yamamoto polymerization, a monomer having two reactive halogen groups is used. Similarly, according to the method of Suzuki polymerization, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerization may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

A single polymer or a plurality of polymers may be deposited from solution to form a layer. Suitable solvents for polyarylenes, in particular polyfluorenes, include mono- or poly-alkylbenzenes such as toluene and xylene. Particularly preferred solution deposition techniques are spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full color displays. Inkjet printing of OLEDs is described in, for example, EP 0880303.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

Numerous hosts for phosphorescent emitters are described in the prior art including "small molecule" hosts such as 4,4'-bis(carbazol-9-yl)biphenyl), known as CBP, and (4,4',4"-tris(carbazol-9-yl)triphenylamine), known as TCTA, disclosed in Ikai et al. (Appl. Phys. Lett., 79 no. 2, 2001, 156); and triarylamines such as tris-4-(N-3-methylphenyl-N-phenyl)phenylamine, known as MTDATA. Polymers are also known as hosts, in particular homopolymers such as poly(vinyl carbazole) disclosed in, for example, Appl. Phys. Lett. 2000, 77(15), 2280; polyfluorenes in Synth. Met. 2001, 116, 379, Phys. Rev. B 2001, 63, 235206 and Appl. Phys. Lett. 2003, 82(7), 1006; poly[4-(N-4-vinylbenzyloxyethyl, N-methylamino)-N-(2,5-di-tert-butylphenylnapthalimide] in Adv. Mater. 1999, 11(4), 285; and poly(para-phenylenes) in J. Mater. Chem. 2003, 13, 50-55. Copolymers are also known as hosts.

Preferred metal complexes for emission comprise optionally substituted complexes of formula (X):

$$ML^1_qL^2_rL^3_s \qquad (X)$$

wherein M is a metal; each of $L^1$, $L^2$ and $L^3$ is a coordinating group; q is an integer; r and s are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet states (phosphorescence). Suitable heavy metals M include:

lanthanide metals such as cerium, samarium, europium, terbium, dysprosium, thulium, erbium and neodymium; and d-block metals, in particular those in rows 2 and 3 i.e. elements 39 to 48 and 72 to 80, in particular ruthenium, rhodium, pallaidum, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission color is determined by the choice of the metal. The sharp emission is generally narrow, resulting in a pure color emission useful for display applications.

The d-block metals form organometallic complexes with carbon or nitrogen donors such as porphyrin or bidentate ligands of formula (XI):

wherein $Ar^7$ and $Ar^8$ may be the same or different and are independently selected from optionally substituted aryl or heteroaryl; $X^1$ and $Y^1$ may be the same or different and are independently selected from carbon or nitrogen; and $Ar^7$ and $Ar^8$ may be fused together. Ligands wherein $X^1$ is carbon and $Y^1$ is nitrogen are particularly preferred.

Examples of bidentate ligands are illustrated below:

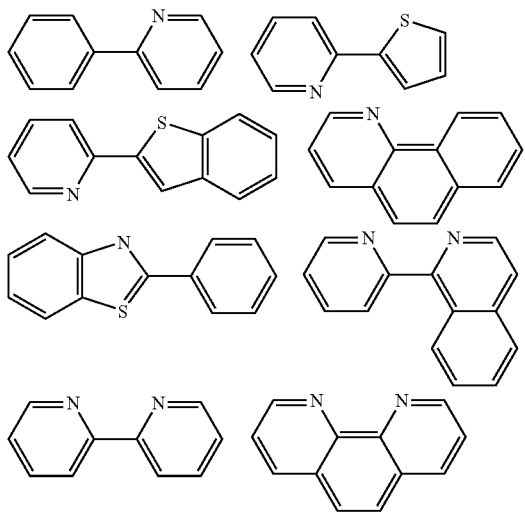

Each of $Ar^7$ and $Ar^8$ may carry one or more substituents. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission color is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

A wide range of fluorescent low molecular weight metal complexes are known and have been demonstrated in organic light emitting devices [see, e.g., Macromol. Sym. 125 (1997) 1-48, U.S. Pat. No. 5,150,006, U.S. Pat. No. 6,083,634 and U.S. Pat. No. 5,432,014], in particular tris-(8-hydroxyquinoline)aluminum. Suitable ligands for di or trivalent metals include: oxinoids, e.g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission color.

EXAMPLE 1

A first device having the following structure was formed:
ITO/PEDOT:PSS/HTL 1/Blue polymer/BaOx 5 nm/Al>250 nm A comparative device having the following structure was formed:
ITO/PEDOT:PSS/HTL 2/Blue polymer/BaOx 5 nm/Al>250 nm The hole transport and blue polymer layers were deposited from solution. The hole transport layer was baked prior to deposition of the electroluminescent layer.

The Tgs of HTL1 and HTL2 are similar.

The blue polymer comprises a polymer comprising fluorene and triarylamine units as disclosed in, for example, WO 02/092723.

The hole transport layer "HTL1" of the first device comprises a hole transporting polymer comprising dialkylfluorene, diarylfluorene and triarylamine repeat units.

The hole transport layer "HTL2" of the comparative device comprises a hole transporting polymer comprising dialkylfluorene and triarylamine repeat units.

Results:

Voltage was measured using a voltmeter. CIE coordinates and luminance were measured using a Minolta CS200 ChromaMeter.

Figure 2:
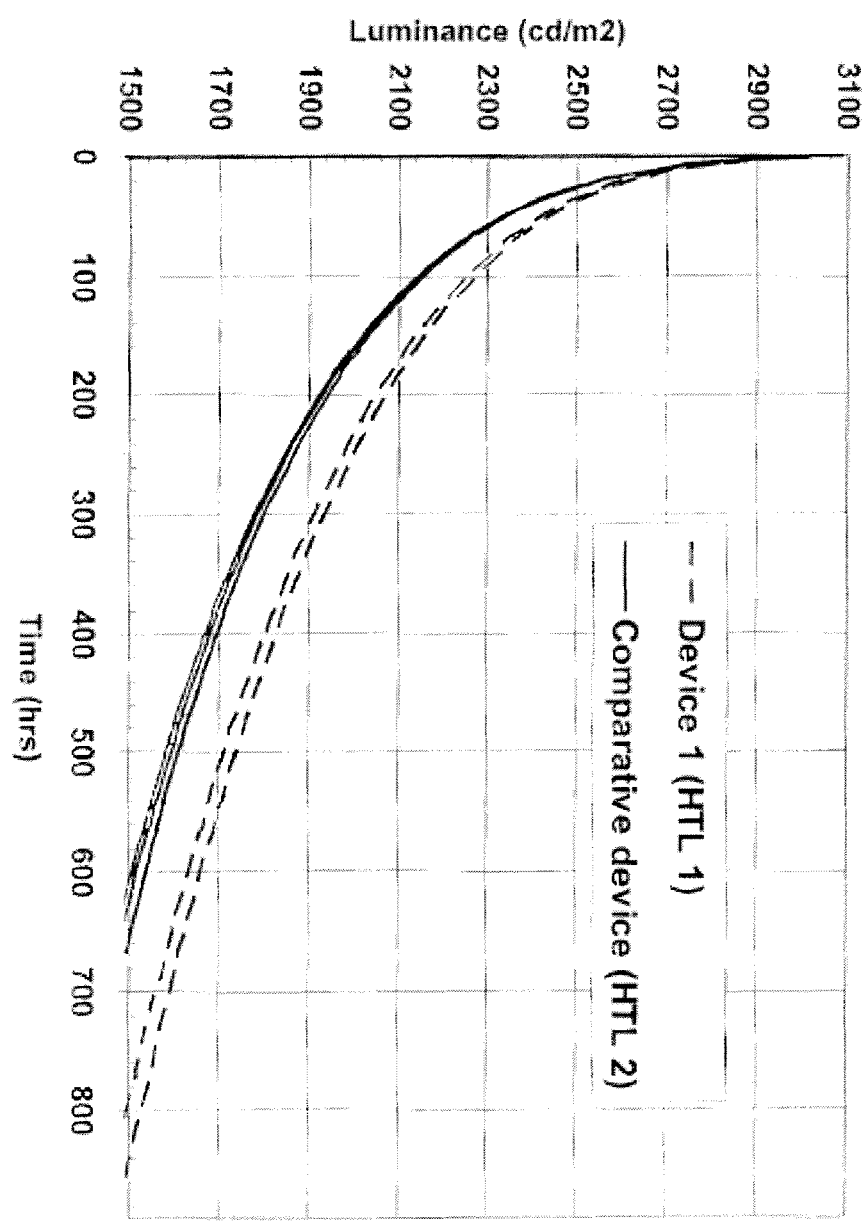
FIG. 2 shows luminance vs. time plots for devices specified in Example 1.

Device results show a similar color and a slight reduction in drive voltage and external quantum efficiency (EQE) for HTL 1 compared to HTL 2. The average lifetime is shown below and the luminance vs time plots are shown in FIG. 2. The results show that HTL 1 improves the lifetime by 30% compared to HTL 2.

| Device | Minolta CIE x | Minolta CIE y | Voltage@ 1000 Cd/m2 | EQE@ 1000 Cd/m2 | LT from 3000 cd/m² |
|---|---|---|---|---|---|
| 1 | 0.138 | 0.211 | 6.0 | 5.9 | 818 |
| Comparative | 0.138 | 0.216 | 6.3 | 6.1 | 631 |

The following data indicates the viability chain length selection to tune the Tg. Using a meta substituted DPF in HTL 1, it is possible to obtain a comparable processing temperature as with HTL 2.

The invention claimed is:

1. An organic light-emitting device comprising:
an anode;
a hole transport layer;
a light-emitting layer; and
a cathode,
wherein the hole transport layer comprises a polymer having a repeat unit comprising a fluorene unit in the polymer backbone and satisfying general formula I:

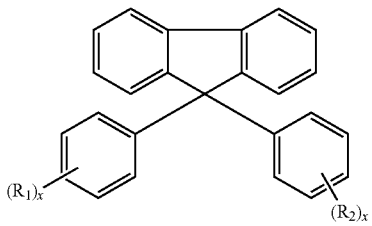

I wherein $R_1$ and $R_2$ represent a linear or branched alkyl group; each x independently is 0 or an integer with the proviso that at least one x is an integer and at least one of $R_1$ and $R_2$ is located at a meta position on the phenyl ring; and the fluorene unit is optionally fused.

2. An organic light-emitting device according to claim 1, wherein the hole transport polymer has a Tg below 200° C.

3. An organic light-emitting device according to claim 1, wherein the hole transport polymer has been reordered by heating after deposition.

4. A method of making a light-emitting device as defined in claim 3, comprising depositing the hole transport layer and then heating the hole transport layer.

5. A method according to claim 4, wherein the hole transport polymer has a Tg below 200° C.

6. A method according to claim 4, wherein the hole transport polymer is soluble so that it is capable of being deposited from solution to form a layer.

7. A method according to claim 4, wherein one or both of $R_1$ and $R_2$ represents a substituent having from 5 to 20 carbon atoms.

8. A method according to claim 4, wherein one of $R_1$ and $R_2$ is located at the para position of the phenyl ring.

9. A method according to claim 4, wherein the hole transport polymer is a copolymer.

10. A method according to claim 9, wherein the hole transport polymer includes a triarylamine repeat unit.

11. A method according to claim 4, wherein the hole transport polymer includes a further fluorene repeat unit satisfying general formula 22:

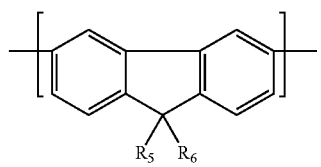

wherein $R_5$ and $R_6$ are independently selected from hydrogen or optionally substituted alkyl, alkoxy, aryl, arylalkyl, heteroaryl and heteroarylalkyl.

12. An organic light-emitting device according to claim 1, wherein the hole transport polymer is soluble so that it is capable of being deposited from solution to form a layer.

13. An organic light-emitting device according to claim 1, wherein the hole transport layer has a HOMO level of about 4.5 to about 5.8 eV.

14. An organic light-emitting device according to claim 1, wherein one or both of $R_1$ and $R_2$ represents a substituent having from 5 to 20 carbon atoms.

15. An organic light-emitting device according to claim 1, wherein both $R_1$ and $R_2$ are located at meta positions.

16. An organic light-emitting device according to claim 1, wherein one of $R_1$ and $R_2$ is located at the para position of the phenyl ring.

17. An organic light-emitting device according to claim 1, wherein the hole transport polymer is a copolymer.

18. An organic light-emitting device according to claim 17, wherein the hole transport polymer includes a triarylamine repeat unit.

19. An organic light-emitting device according to claim 17, wherein the hole transport polymer includes from 30 to 80 mol % of a repeat unit satisfying general formula I.

20. An organic light-emitting device according to claim 17, wherein the hole transport polymer is a copolymer of a repeat unit satisfying general formula I and a triarylamine repeat unit.

21. An organic light-emitting device according to claim 17, wherein the hole transport polymer includes a further fluorene repeat unit satisfying general formula 22:

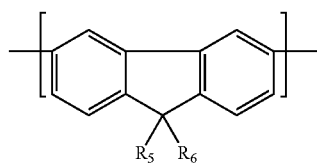

wherein $R_5$ and $R_6$ are independently selected from hydrogen or optionally substituted alkyl, alkoxy, aryl, arylalkyl, heteroaryl and heteroarylalkyl.

22. An organic light-emitting device according to claim 1, wherein the light-emitting device further has a hole injection layer located between the anode and the hole transport layer.

23. An organic light-emitting device according to claim 22, wherein the hole injection layer comprises a conductive organic material.

24. An organic light-emitting device according to claim 1, wherein the device is comprised in a full color display having blue, red and green light-emitting layers, where the hole transport layer is shared by the blue, red and green electroluminescent materials.

25. A polymer suitable for use as a hole transport polymer in a light-emitting device, wherein the polymer has a repeat unit satisfying general formula I:

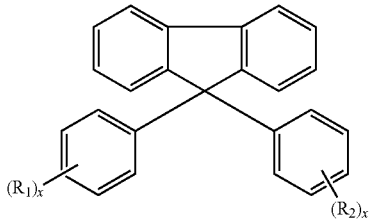

I wherein $R_1$ and $R_2$ represent a linear or branched alkyl group; each x independently is 0 or an integer with the proviso that at least one x is an integer and at least one of $R_1$ and $R_2$ is located at a meta position on the phenyl ring; and the fluorene unit is optionally fused, characterized in that the polymer has a glass transition temperature below 175° C.

26. A polymer according to claim 25, wherein the polymer is soluble so that it is capable of being deposited from solution to form a layer.

27. A polymer according to claim 25, wherein one or both of $R_1$ and $R_2$ represents a substituent having from 5 to 20 carbon atoms.

28. A polymer according to claim 25, wherein one of $R_1$ and $R_2$ is located at the para position of the phenyl ring.

29. A polymer according to claim 25, wherein the polymer is a copolymer.

30. A polymer according to claim 29, wherein the copolymer includes a triarylamine repeat unit.

31. A polymer according to claim 25, wherein the polymer includes a further fluorene repeat unit satisfying general formula 22:

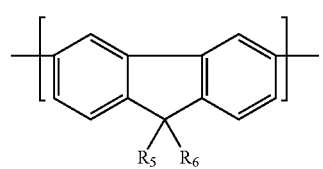

22 wherein $R_5$ and $R_6$ are independently selected from hydrogen or optionally substituted alkyl, alkoxy, aryl, arylalkyl, heteroaryl and heteroarylalkyl.

* * * * *